United States Patent
Cheung et al.

(10) Patent No.: US 7,453,970 B2
(45) Date of Patent: Nov. 18, 2008

(54) CLOCK SIGNAL SELECTING APPARATUS AND METHOD THAT GUARANTEE CONTINUITY OF OUTPUT CLOCK SIGNAL

(75) Inventors: Tae Sik Cheung, Daejeon (KR); Bhum Cheol Lee, Daejeon (KR); Bong Tae Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 818 days.

(21) Appl. No.: 10/928,575

(22) Filed: Aug. 26, 2004

(65) Prior Publication Data
US 2005/0084050 A1    Apr. 21, 2005

(30) Foreign Application Priority Data
Oct. 21, 2003    (KR)    .................... 10-2003-0073444

(51) Int. Cl.
*H04L 7/02*    (2006.01)
(52) U.S. Cl. .................. 375/360; 375/371; 375/373; 370/518; 327/144; 327/152

(58) Field of Classification Search ................ 375/354, 375/360, 371, 373, 375; 370/516, 518; 327/141, 327/144, 152, 155
See application file for complete search history.

(56) References Cited

U.S. PATENT DOCUMENTS

| | | | | |
|---|---|---|---|---|
| 5,355,090 A | * | 10/1994 | Pajowski et al. | ............ 327/292 |
| 5,515,403 A | * | 5/1996 | Sloan et al. | ................ 375/371 |
| 6,052,007 A | | 4/2000 | Ono | |
| 6,429,707 B1 | | 8/2002 | Lamb et al. | |
| 6,549,046 B1 | | 4/2003 | Klecka, III | |
| 6,653,874 B2 | * | 11/2003 | Ishikawa | ................... 327/144 |
| 6,750,687 B1 | * | 6/2004 | Klecka, III | ................... 327/153 |
| 7,088,155 B2 | * | 8/2006 | Takahashi | ................... 327/144 |

* cited by examiner

*Primary Examiner*—Dac V Ha
(74) *Attorney, Agent, or Firm*—Blakely, Sokoloff, Taylor & Zafman

(57) ABSTRACT

Provided are a clock signal selecting apparatus and method that can guarantee the continuity of an output clock signal. The clock signal selecting apparatus and method can synchronize the phases of at least two clock signals by continuously controlling the phases of the clock signals. Accordingly, even when an active clock signal and a standby clock signal have different frequencies, it is possible to guarantee the continuity of the output clock signal regardless of whether the clock signals are switched from one to another. In addition, it is possible to guarantee the stability of the output clock signal.

24 Claims, 8 Drawing Sheets

CLOCK SIGNAL SELECTING APPARATUS AND METHOD THAT GUARANTEE CONTINUITY OF OUTPUT CLOCK SIGNAL

This application claims the priority of Korean Patent Application No. 2003-73444, filed on Oct. 21, 2003, in the Korean Intellectual Property Office, the disclosure of which is incorporated herein in its entirety by reference.

BACKGROUND OF THE INVENTION

1. Field of the Invention

The present invention relates to control of a clock signal, and more particularly, to a clock signal selecting apparatus and method that guarantee the continuity of an output clock signal.

2. Description of the Related Art

Frequency synchronization is necessary between data transmission/communication systems and between devices in each of the data transmission/communication systems. Especially, for a high-speed/large-capacity data communication system or a high-precision frequency hierarchy-based data transmission system, frequency synchronization with the help of a timing device, such as a network synchronous device, is more than a requirement.

In addition, devices in a cheap small capacity data communication system may operate asynchronously or synchronously after their frequencies are synchronized with one another. For example, a switch fabric, which is an element of a data communication system, needs to synchronize a clock signal for a switch card with a clock signal for a line card so as to enhance the reliability of a serial link between the switch card and the line card.

In order to synchronize clock signals output from different systems or different devices in each of the different systems, a dual timing apparatus is used to provide a synchronization clock signal in consideration of the stability and reliability of each of the different systems. However, the dual timing apparatus includes two timing devices disposed in different places and inevitably has a complicated circuit structure in order to synchronize clock signals output from the two timing devices with each other. In this regard, the dual timing apparatus is not cost-effective, and it is difficult to distribute the clock signals from the two timing devices along the same path.

SUMMARY OF THE INVENTION

The present invention provides a clock signal selecting apparatus and method that can guarantee the continuity of an output clock signal even when switching a plurality of input clock signals from one to another by synchronizing the phases of the plurality of input clock signals with one another in real time.

According to an aspect of the present invention, there is provided a clock signal selecting apparatus that guarantees the continuity of an output clock signal. The clock signal selecting apparatus includes N phase comparators, which compare the phases of N clock signals with the phase of one of the N clock signals, which is an active clock signal, and generate N control signals that control the phases of the N clock signals to follow the phase of the predetermined clock signal; N phase controllers, which control the phases of the N clock signals in response to the N control signals and generate N phase-controlled clock signals; and a selector, which selects one of the N phase-controlled clock signals corresponding to the active clock signal.

According to another aspect of the present invention, there is provided a clock signal selecting apparatus that guarantees the continuity of an output clock signal. The clock signal selecting apparatus includes a first phase comparator, which compares first and second phase-controlled clock signals with each other and generates a first control signal that controls the phase of the first phase-controlled clock signal to follow the phase of the second phase-controlled clock signal; a second phase comparator, which compares the first and second phase-controlled clock signals with each other and generates a second control signal that controls the phase of the second phase-controlled clock signal to follow the phase of the first phase-controlled clock signal; a first phase controller, which generates the first phase-controlled clock signal by controlling the phase of a first clock signal and controls the phase of the first phase-controlled clock signal in response to the first control signal; a second phase controller, which generates the second phase-controlled clock signal by controlling the phase of a second clock signal and controls the phase of the second phase-controlled clock signal in response to the second control signal; and a selector, which selects one of the first and second phase-controlled clock signals output from the first and second phase controllers, respectively.

According to another aspect of the present invention, there is provided a clock signal selecting apparatus that guarantees the continuity of an output clock signal. The clock signal selecting apparatus includes a first multi-phase clock signal generator, which converts a first clock signal into a plurality of first multi-phase clock signals; a second multi-phase clock signal generator, which converts a second clock signal into a plurality of second multi-phase clock signals; a first phase comparator/controller, which compares the phases of the first multi-phase clock signals with the phase of a second phase-controlled clock signal and generates a first phase-controlled clock signal by controlling the phase of the first clock signal based on comparison results, the second phase-controlled clock signal being obtained by controlling the phase of the second clock signal; a second phase comparator/controller, which compares the phases of the second multi-phase clock signals with the phase of the first phase-controlled clock signal, generates the second phase-controlled clock signal by controlling the phase of the second clock signal based on comparison results, and outputs the second phase-controlled clock signal to the first phase comparator/controller; and a selector, which outputs one of the first and second phase-controlled clock signals in response to a clock selection signal input from the outside of the clock signal selecting apparatus.

According to another aspect of the present invention, there is provided a clock signal selecting method that guarantees the continuity of an output clock signal. The clock signal selecting method involves (a) comparing the phases of N clock signals with the phase of one of the N clock signals, which is an active clock signal; (b) generating a control signal that controls the phase of each of the N clock signals to follow the phase of the predetermined clock signal; (c) generating N phase-controlled clock signals by controlling the phases of the N clock signals in response to the control signal; and (d) selecting one of the N phase-controlled clock signals corresponding to the active clock signal.

According to another aspect of the present invention, there is provided a clock signal selecting method that guarantees the continuity of an output clock signal. The clock signal selecting method involves (a) comparing first and second phase-controlled clock signals, which are obtained by controlling the phases of first and second clock signals, with each other and generating a first control signal that controls the phase of the first phase-controlled clock signal to follow the phase of the second phase-controlled clock signal; (b) comparing the first and second phase-controlled clock signals with each other and generating a second control signal that controls the phase of the second phase-controlled clock signal to follow the phase of the first phase-controlled clock signal; (c) controlling the phase of the first phase-controlled clock signal in response to the first control signal; (d) controlling the phase of the second phase-controlled clock signal in response to the second control signal; and (e) selecting one of the first and second phase-controlled clock signals whose phases are controlled in (c) and (d), respectively.

According to another aspect of the present invention, there is provided a clock signal selecting method that guarantees the continuity of an output clock signal. The clock signal selecting method involves (a) converting a first clock signal into a plurality of first multi-phase clock signals, and converting a second clock signal into a plurality of second multi-phase clock signals; (b) comparing the phases of the first multi-phase clock signals with the phase of a second phase-controlled clock signal and selecting at least two of the first multi-phase clock signals having almost the same phase as the second phase-controlled clock signal; (c) comparing the phases of the second multi-phase clock signals with the phase of a first phase-controlled clock signal and selecting at least two of the second multi-phase clock signals having almost the same phase as the first phase-controlled clock signal; (d) if the first clock signal is an active clock signal, generating the first phase-controlled clock signal having a constant phase difference with the first clock signal and generating the second phase-controlled clock signal by combining the second multi-phase clock signals selected in (c) together; (e) if the second clock signal is the active signal, generating the first phase-controlled clock signal having a constant phase difference with the second clock signal and generating the first phase-controlled clock signal by combining the first multi-phase clock signals selected in (b) together; and (f) outputting one of the first or second clock signals, which is designated as the active clock signal, as an output clock signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
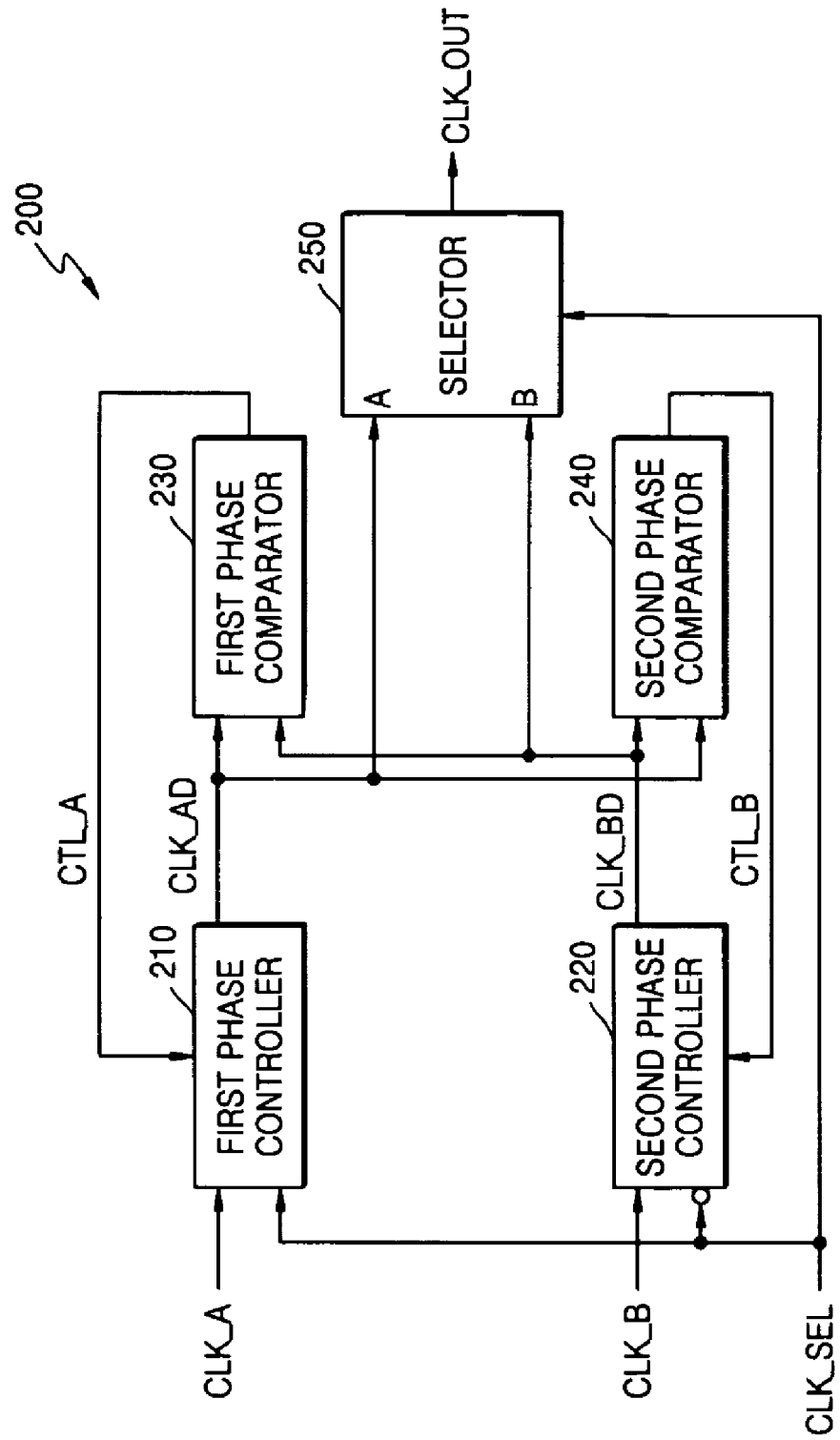
FIG. 1 is a block diagram illustrating a clock signal selecting apparatus according to an exemplary embodiment of the present invention.

FIG. 1 is a block diagram illustrating a clock signal selecting apparatus 200 according to an exemplary embodiment of the present invention. Referring to FIG. 1, the clock signal selecting apparatus 200 includes a first phase controller 210, a second phase controller 220, a first phase comparator 230, and a second phase comparator 240, and a selector 250.

The first phase controller 210 receives a first clock signal CLK_A, which is one of two synchronization clock signals, a first control signal CTL_A, which is generated from the first phase controller 230, and a clock selection signal CLK_SEL and outputs a first phase-controlled clock signal CLK_AD. If the first clock signal CLK_A is set as a standby clock signal, the phase of the first phase-controlled clock signal CLK_AD output from the first phase controller 210 varies in response to the first control signal CTL_A. On the other hand, if the first clock signal CLK_A is set as an active clock signal, the first phase-controlled clock signal CLK_AD maintains a current phase. Here, it is determined whether the first clock signal CLK_A is set as the active clock signal or the standby clock signal by referring to a logic value of the clock selection signal CLK_SEL.

The second phase controller 220 receives a second clock signal CLK_B, which is the other synchronization clock signals, a second control signal CTL_B, which is generated from the second phase controller 240, and an inversed signal of the clock selection signal CLK_SEL and outputs a second phase-controlled clock signal CLK_BD. If the second clock signal CLK_B is set as a standby clock signal, the phase of the second phase-controlled clock signal CLK_BD varies in response to the second control signal CLT_B. On the other hand, if the second clock signal CLK_B is set as an active clock signal, the second phase-controlled clock signal CLK_BD maintains a current phase. Here, it is determined whether the second clock signal CLK_B is set as the active clock signal or the standby clock signal by referring to a logic value of the inversed signal of the clock selection signal CLK_SEL.

The first phase comparator 230 compares the phase of the first phase-controlled clock signal CLK_AD output from the first phase controller 210 with the phase of the second phase-controlled clock signal CLK_BD output from the second phase controller 220 and outputs, based on the comparison result, the first control signal CTL_A that controls the phase of the first phase-controlled clock signal CLK_AD to follow the phase of the second phase-controlled clock signal CLK_BD to the first phase controller 210.

The second phase comparator 240 compares the phase of the first phase-controlled clock signal CLK_AD output from the first phase controller 210 with the phase of the second phase-controlled clock signal CLK_BD output from the second phase controller 220 and outputs, based on the comparison result, the second control signal CTL_B that controls the phase of the second phase-controlled clock signal CLK_BD to follow the phase of the first phase-controlled clock signal CLK_AD to the second phase controller 220.

The selector 250 receives the first and second phase-controlled clock signals CLK_AD and CLK_BD from the first and second phase controllers 210 and 220, respectively, selects one of the first and second phase-controlled clock signals CLK_AD and CLK_BD in response to the clock selection signal CLK_SEL, and outputs the selected phase-controlled clock signal.

As described above, the clock signal selecting apparatus 200 controls the phases of the first and second clock signals CLK_A and CLK_B and selects one of the first and second phase-controlled clock signals CLK_AD and CLK_BD. However, the clock signal selecting apparatus 200 may include more than two phase controllers and more than two phase comparators. Thus, the clock signal selecting apparatus 200 may be able to control the phases of more than two clock signals and select one of more than two phase-controlled clock signals.

Figure 2:
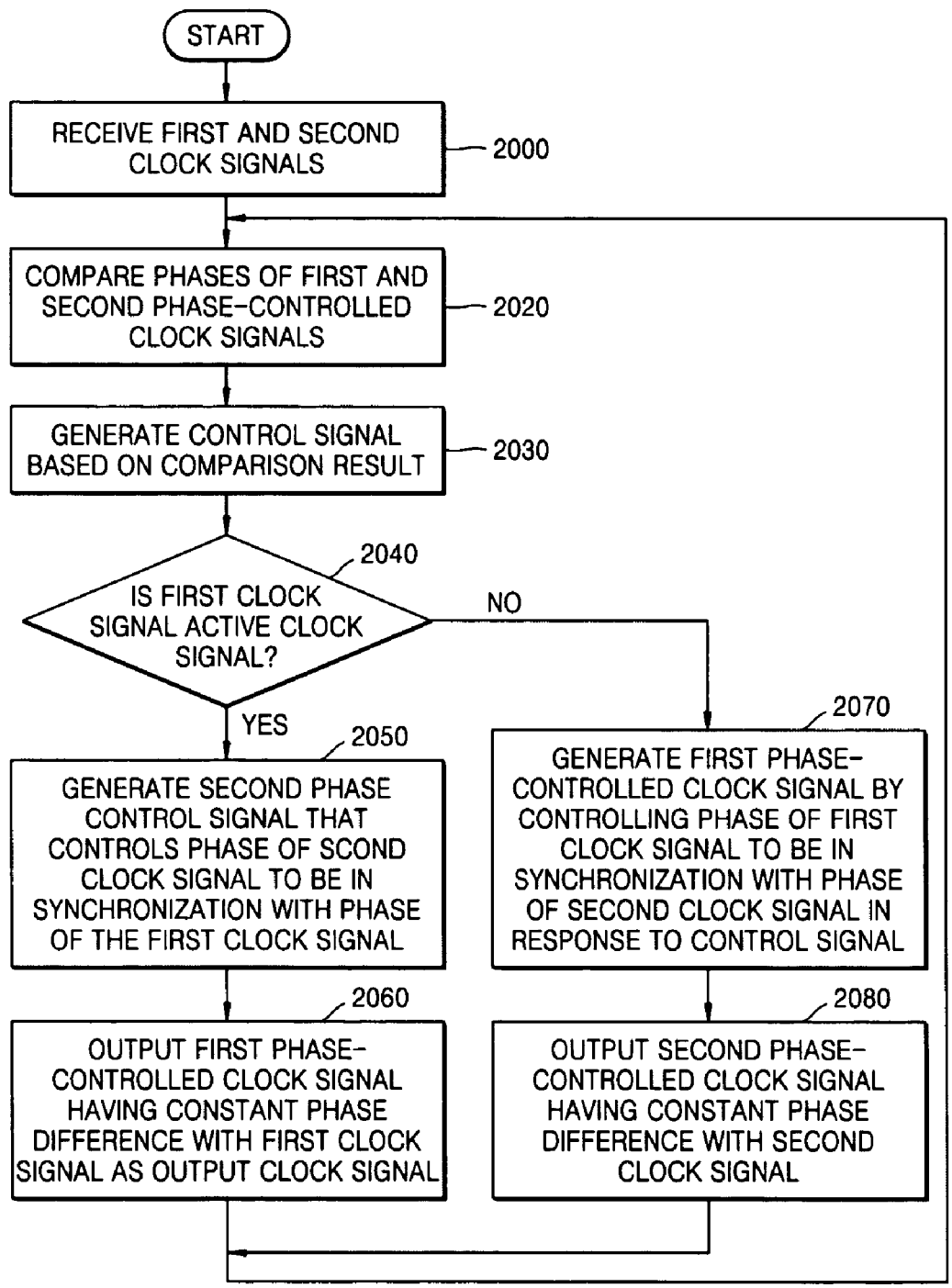
FIG. 2 is a flowchart illustrating a clock signal selecting method according to an exemplary embodiment of the present invention.

FIG. 2 is a flowchart illustrating a clock signal selecting method according to an exemplary embodiment of the present invention. For the convenience of explanation, it is assumed that a first clock signal CLK_A is set as an active clock signal when a clock selection signal CLK_SEL has a logic value of 0 and a second clock signal CLK_B is set as an active clock signal when the clock selection signal CLK_SEL has a logic value of 1. The logic value of the clock selection signal CLK_SEL may be controlled by a user command or based on a result of a clock inspection circuit (not shown) determining the states of clock signals.

The operation of the clock signal selecting apparatus 200 will be described more fully with reference to FIGS. 1 and 2. In operation 2000, the clock signals CLK_A and CLK_B input to the clock signal selecting apparatus 200 are processed by the first and second phase controllers 210 and 220, respectively, and the first and second phase-controlled clock signals CLK_AD and CLK_BD generated from the first and second phase controllers 210 and 220, respectively, are input to the first and second phase comparators 230 and 240 and the selector 250.

In operation 2020, the first and second phase comparators 230 and 240 each compare the first and second phase-controlled clock signals CLK_AD and CLK_BD. In operation 2030, the first and second phase comparators 230 and 240 respectively generate the first and second control signals CTL_A and CTL_B as comparison results. More specifically, the first phase comparator 230 compares the phase of the first phase-controlled clock signal CLK_AD with the phase of the second phase-controlled clock signal CLK_BD and outputs the first control signal CLK_A, which controls the phase of the first phase-controlled clock signal CLK_AD to follow the phase of the second phase-controlled clock signal CLK_BD, to the first phase controller 210. The second phase comparator 240 compares the phase of the first phase-controlled clock signal CLK_AD with the phase of the second phase-controlled clock signal CLK_BD and outputs the second control signal CLK_B, which controls the phase of the second phase-controlled clock signal CLK_BD to follow the phase of the first phase-controlled clock signal CLK_AD, to the second phase controller 220.

In operation 2040, it is determined whether the first clock signal CLK_A is an active clock signal. If the clock selection signal is set to a logic value of 0, and thus, the first clock signal CLK_A turns out to be an active clock signal, then the first phase controller 210 outputs the first phase-controlled clock signal CLK_AD, which has a constant phase difference with the first clock signal CLK_A, to the first and second phase comparators 230 and 240 and the selector 250 regardless of the first control signal CTL_A. Then, in operation 2050, the second phase controller 220 controls the phase of the second phase-controlled clock signal CLK_BD to follow the phase of the first phase-controlled clock signal CLK_AD in response to the second control signal CTL_B generated from the second phase comparator 240 and outputs the resulting second phase-controlled clock signal CLK_BD to the first and second phase comparators 230 and 240 and the selector 250. In operation 2060, the selector 250 selects the first phase-controlled clock signal CLK_AD, which is an active clock signal, from between the first and second phase-controlled clock signals CLK_AD and CLK_BD in response to the clock selection signal CLK_SEL and outputs the first phase-controlled phase clock signal CLK_AD as an output clock signal CLK_OUT.

Even though the clock signal selecting apparatus 200 only outputs the first phase-controlled clock signal CLK_AD selected by the selector 250, the first and second phase-controlled clock signals CLK_AD and CLK_BD have already been controlled to be in synchronization with each other within a predetermined error range. Therefore, even when the first and second phase-controlled clock signals CLK_AD and CLK_BD are switched from one to the other, it is possible to continuously provide a stable output clock signal (CLK_OUT).

If the clock selection signal CLK_SEL is set to a logic value of 1, and thus, the first clock signal CLK_A turns out not to be an active clock signal, then the first phase controller 210 controls the phase of the first phase-controlled clock signal CLK_AD to follow the phase of the second phase-controlled clock signal CLK_BD in response to the first control signal CTL_A generated from the first phase controller 230 and outputs the resulting the first phase-controlled clock signal CLK_AD to the first and second phase comparators 230 and 240 and the selector 250. Thereafter, in operation 2070, the second phase controller 220 outputs the second phase-controlled clock signal CLK_BD, which has a constant phase difference with the first phase-controlled clock signal CLK_AD, to the first and second phase comparators 230 and 240 and the selector 250 regardless of the second control signal CTL_B. In operation 2080, the selector 250 selects the second phase-controlled clock signal CLK_BD, which is an active clock signal, from between the first and second phase-controlled clock signals CLK_AD and CLK_BD and outputs the second phase-controlled clock signal CLK_BD as the output clock signal CLK_OUT.

Even though the clock signal selecting apparatus 200 only outputs the second phase-controlled clock signal CLK_BD selected by the selector 250, the first and second phase-controlled clock signals CLK_AD and CLK_BD have already been controlled to be in synchronization with each other within a predetermined error range. Therefore, even when the first and second phase-controlled clock signals CLK_AD and CLK_BD are switched from one to the other, it is possible to continuously provide a stable output clock signal (CLK_OUT). The processes of controlling the phases of the first and second phase-controlled clock signals CLK_AD and CLK_BD described above are performed every clock cycle.

Figure 3:
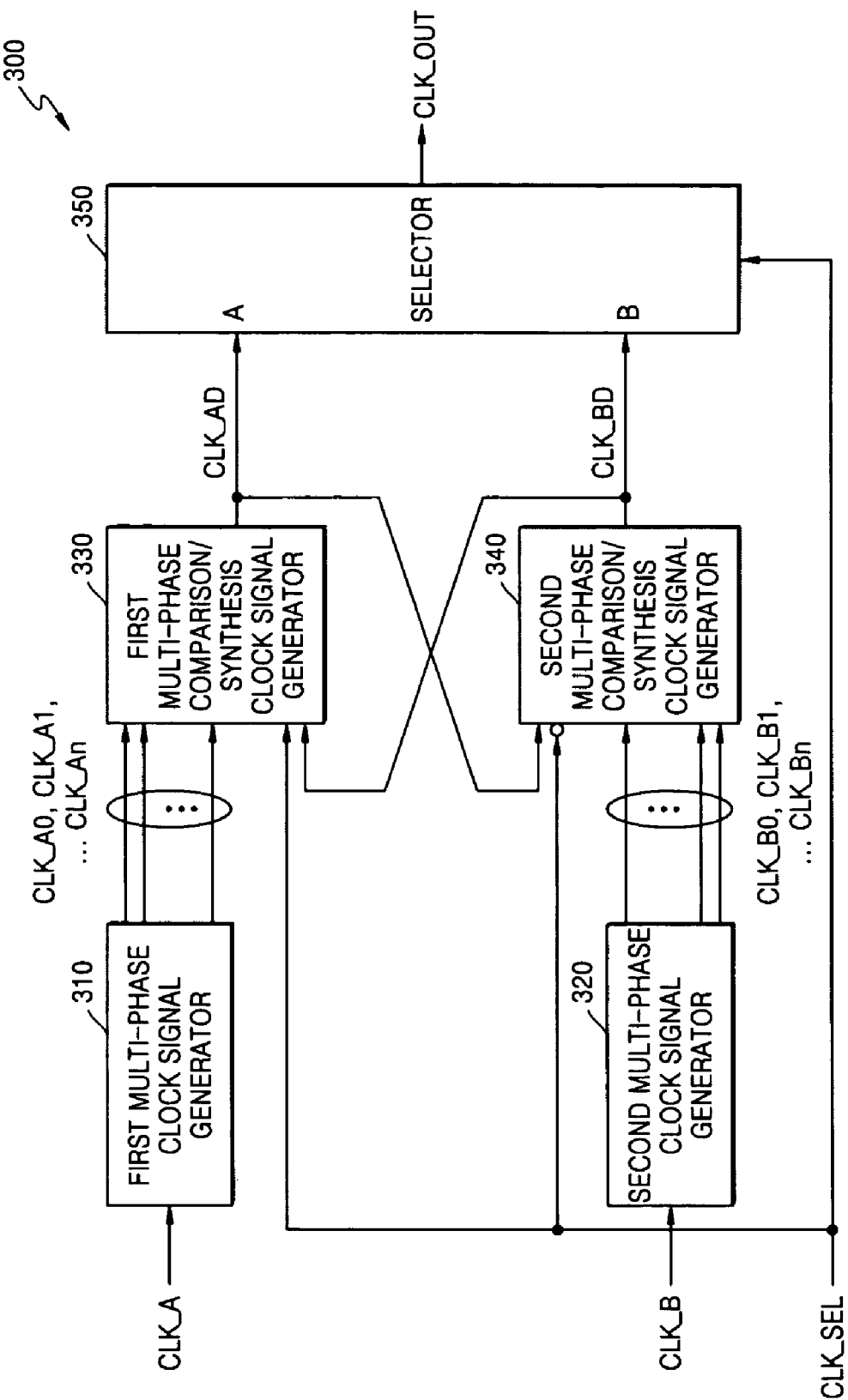
FIG. 3 is a block diagram illustrating a clock signal selecting apparatus according to another exemplary embodiment of the present invention.

FIG. 3 is a block diagram illustrating a clock signal selecting apparatus 300 according to another exemplary embodiment of the present invention. Referring to FIG. 3, the clock signal selecting apparatus 300 includes a first multi-phase clock signal generator 310, a second multi-phase clock signal generator 320, a first multi-phase comparison/synthesis clock signal generator 330, a second multi-phase comparison/synthesis clock signal generator 340, and a selector 350.

The first multi-phase clock signal generator 310 receives a first clock signal CLK_A, which is one of two synchronization clock signals, and generates n+1 (where n is a positive integer) multi-phase clock signals CLK_A0 through CLK_An. The second multi-phase clock signal generator 320 receives a second clock signal CLK_B, which is the other synchronization clock signal, and generates n+1 multi-phase clock signals CLK_B0 through CLK_Bn.

The first multi-phase comparison/synthesis clock signal generator 330 receives the multi-phase clock signals CLK_A0 through CLK_An generated from the first multi-phase clock signal generator 310, the multi-phase clock signals CLK_B0 through CLK_Bn generated from the second multi-phase clock signal generator 320, and a clock selection signal CLK_SEL and generates a first phase-controlled clock signal CLK_AD, the phase of which is controlled to follow the phase of a second phase-controlled clock signal CLK_BD. For this, the first multi-phase comparison/synthesis clock signal generator 330 compares the phases of the multi-phase clock signals CLK_A0 through CLK_An with the phase of the second phase-controlled clock signal CLK_BD and selects at least two of the multi-phase clock signals CLK_A0 through CLK_An that have smaller phase differences with the second phase-controlled clock signal CLK_BD. Thereafter, the first multi-phase comparison/synthesis clock signal generator 330 combines the selected multi-phase clock signals together, thereby generating the first phase-controlled clock signal CLK_AD, the phase of which follows the phase of the second phase-controlled clock signal CLK_BD. Alternatively, the first multi-phase comparison/synthesis clock signal generator 330 may generate the first phase-controlled clock signal CLK_AD, which has a constant phase difference with the first clock signal CLK_A, by using some of the multi-phase clock signals CLK_A0 through CLK_An previous selected. The first phase-controlled clock signal CLK_AD output from the first multi-phase comparison/synthesis clock signal generator 330 is input to the second multi-phase comparison/synthesis clock signal generator 340 and the selector 350. The operation of the first multi-phase comparison/synthesis clock signal generator 330 is controlled depending on which logic value the clock selection signal CLK_SEL is set to.

The second multi-phase comparison/synthesis clock signal generator 340 receives the multi-phase clock signals CLK_B0 through CLK_Bn generated from the second multi-phase clock signal generator 320, the multi-phase clock signals CLK_A0 through CLK_An generated from the first multi-phase clock signal generator 310, and an inversed signal of the clock selection signal CLK_SEL and generates the second phase-controlled clock signal CLK_BD, the phase of which is controlled to follow the phase of the first phase-controlled clock signal CLK_AD. For this, the second multi-phase comparison/synthesis clock signal generator 340 compares the phases of the multi-phase clock signals CLK_B0 through CLK_Bn with the phase of the first phase-controlled clock signal CLK_AD and selects at least two of the multi-phase clock signals CLK_B0 through CLK_Bn that have smaller phase differences with the first phase-controlled clock signal CLK_AD. Thereafter, the second multi-phase comparison/synthesis clock signal generator 340 combines the selected multi-phase clock signals together, thereby generating the second phase-controlled clock signal CLK_BD, the phase of which follows the phase of the first phase-controlled clock signal CLK_AD. Alternatively, the first multi-phase comparison/synthesis clock signal generator 330 may generate the second phase-controlled clock signal CLK_BD, which has a constant phase difference with the second clock signal CLK_B, by using some of the multi-phase clock signals CLK_B0 through CLK_Bn previous selected. The second phase-controlled clock signal CLK_BD output from the second multi-phase comparison/synthesis clock signal generator 340 is input to the first multi-phase comparison/synthesis clock signal generator 330 and the selector 350. The operation of the second multi-phase comparison/synthesis clock signal generator 340 is controlled depending on which logic value the clock selection signal CLK_SEL is set to.

The selector 350 selects one of the first and second phase-controlled clock signals CLK_AD and CLK_BD output from the first and second multi-phase comparison/synthesis clock signal generators 330 and 340 in response to the clock selection signal CLK_SEL and outputs the selected phase-controlled clock signal as an output clock signal CLK_OUT.

As described above, the clock signal selecting apparatus 300 controls the phases of the first and second clock signals CLK_A and CLK_B and selects one of the first and second phase-controlled clock signals CLK_AD and CLK_BD as the output clock signal CLK_OUT. However, the clock signal selecting apparatus 300 may include more than two multi-phase clock signal generators and more than two multi-phase comparison/synthesis clock signal generators. Thus, the clock signal selecting apparatus 300 may be able to control the phases of more than two clock signals and select one of more than two phase-controlled clock signals.

Figure 4A:
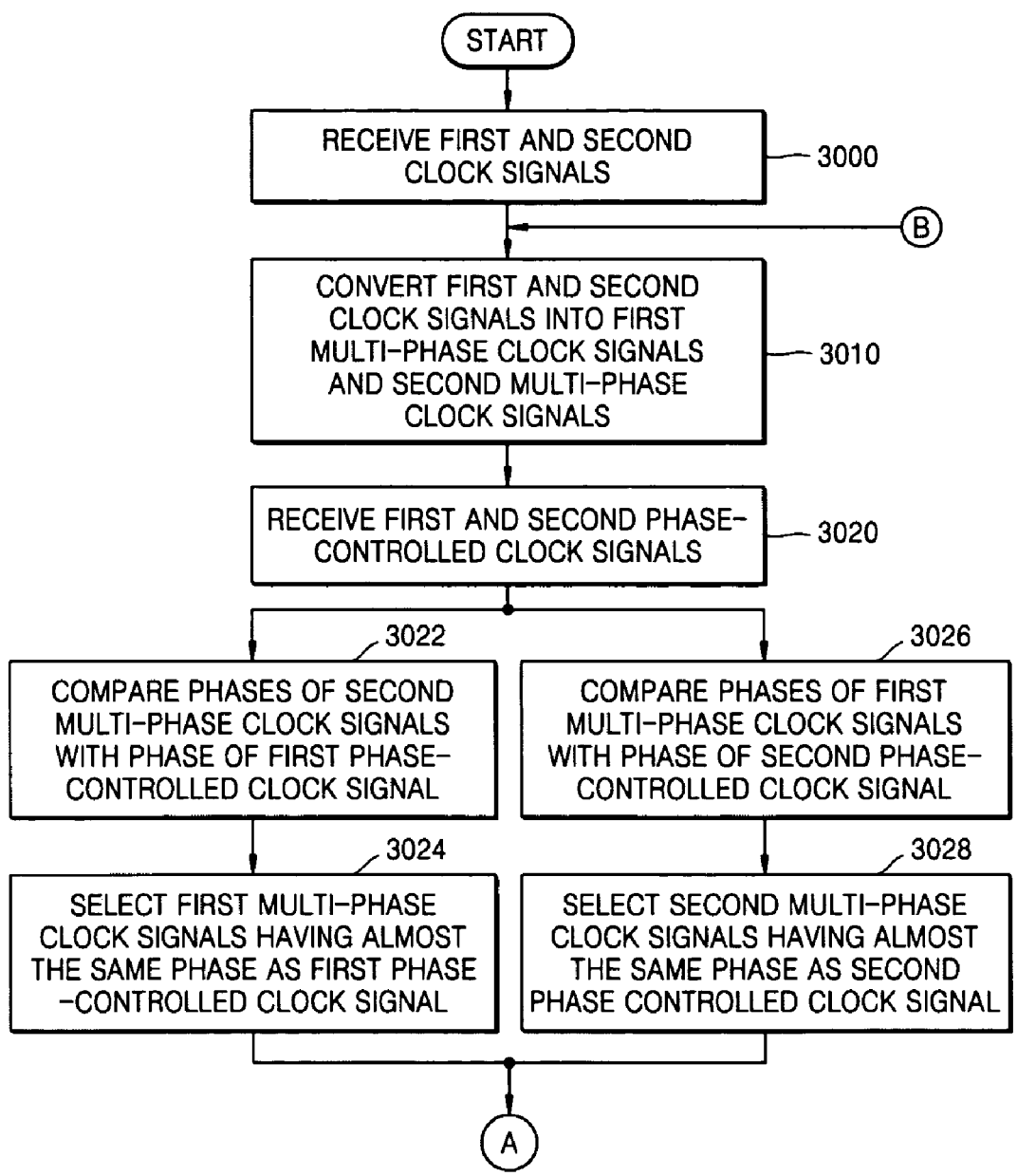
FIG. 4 is a flowchart illustrating a clock signal selecting method according to another exemplary embodiment of the present invention.
Figure 4B:
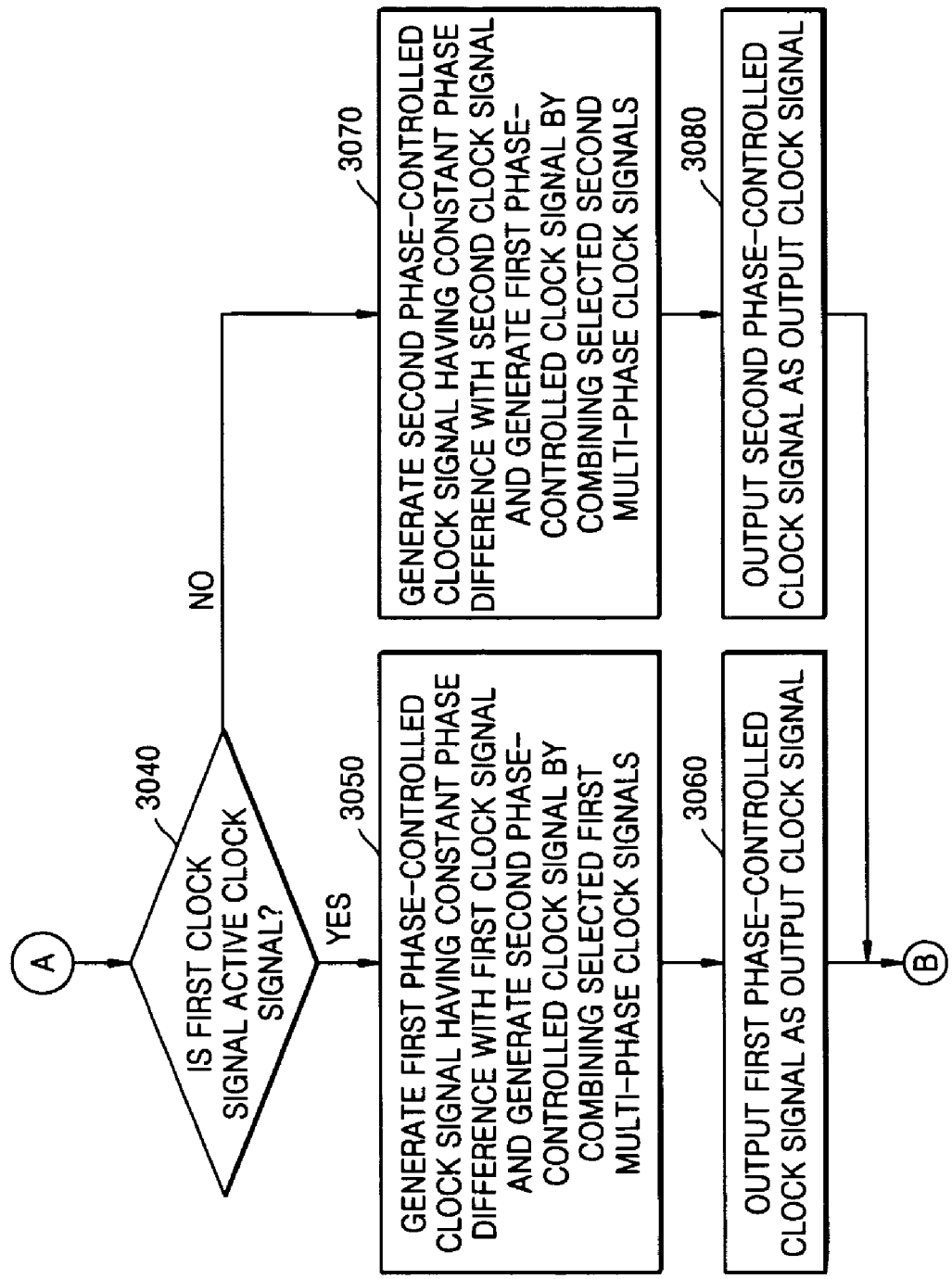

FIG. 4 is a flowchart illustrating a clock signal selecting method according to another exemplary embodiment of the present invention. The operation of the clock signal selecting apparatus 300 will now be described with reference to FIGS. 3 and 4.

In operation 3000, the first and second multi-phase clock signal generators 310 and 320 receive the clock signals CLK_A and CLK_B, respectively. In operation 3010, the first and second multi-phase clock signal generators 310 and 320 respectively generate the n+1 multi-phase clock signals CLK_A0 through CLK_An and the n+1 multi-phase clock signals CLK_B0 through CLK_Bn.

In operation 3020, the first multi-phase comparison/synthesis clock signal generator 330 receives the second phase-controlled clock signal CLK_BD from the second multi-phase comparison/synthesis clock signal generator 340. In operation 3026, the first multi-phase comparison/synthesis clock signal generator 330 compares the phases of the multi-phase clock signals CLK_A0 through CLK_An with the phase of the second phase-controlled clock signal CLK_BD. In operation 3028, the first multi-phase comparison/synthesis clock signal generator 330 selects at least two of the multi-phase clock signals CLK_A0 through CLK_An having smaller phase differences with the second phase-controlled clock signal CLK_BD.

In operation 3020, the second multi-phase comparison/synthesis clock signal generator 340 receives the first phase-controlled clock signal CLK_AD from the first multi-phase comparison/synthesis clock signal generator 330. In operation 3022, the second multi-phase comparison/synthesis clock signal generator 340 compares the phases of the multi-phase clock signals CLK_B0 through CLK_Bn with the phase of the first phase-controlled clock signal CLK_AD. In operation 3024, the second multi-phase comparison/synthesis clock signal generator 340 selects at least two of the multi-phase clock signals CLK_B0 through CLK_Bn having smaller phase differences with the first phase-controlled clock signal CLK_AD.

In operation 3040, it is determined based on a logic value of the clock selection signal CLK_SEL whether the first clock signal CLK_A is an active clock signal.

In operation 3050, if the first clock signal CLK_A is an active clock signal, the first multi-phase comparison/synthesis clock signal generator 330 generates a first phase-controlled clock signal CLK_AD, which has a constant phase difference with the first clock signal CLK_A, by combining together multi-phase clock signals selected in operation 3028 of a previous round, instead of those selected in operation 3020 of this round, and the second multi-phase comparison/synthesis clock signal generator 340 generates a second phase-controlled clock signal CLK_BD, the phase of which follows the phase of the first phase-controlled clock signal CLK_AD, by combining the multi-phase clock signals selected in operation 3024 together. In operation 3060, the first phase-controlled clock signal CLK_AD, which is an active clock signal, is output as the output clock signal CLK_OUT via the selector 350.

Even though the clock signal selecting apparatus 300 only outputs the first phase-controlled clock signal CLK_AD selected by the selector 350, the first and second phase-controlled clock signals CLK_AD and CLK_BD output from the first and second multi-phase comparison/synthesis clock signal generators 330 and 340 have already been controlled to be in synchronization with each other within a predetermined error range. Therefore, even when the first and second phase-controlled clock signals CLK_AD and CLK_BD are switched from one to the other, it is possible to continuously provide a stable output clock signal (CLK_OUT).

In operation 3070, if the second clock signal CLK_B is an active clock signal, the first multi-phase comparison/synthesis clock signal generator 330 generates a first phase-controlled clock signal CLK_AD, the phase of which follows the phase of the second phase-controlled clock signal CLK_BD, by combining the multi-phase clock signals selected in operation 3028 together, and the second multi-phase comparison/synthesis clock signal generator 340 generates a second phase-controlled clock signal CLK_BD, which has a constant phase difference with the phase of the first phase-controlled clock signal CLK_AD, by combining together multi-phase clock signals selected in operation 3024 of the previous round, instead of those selected in operation 3020 of this round. In operation 3080, the second phase-controlled clock signal CLK_BD, which is an active clock signal, is output as the output clock signal CLK_OUT via the selector 350.

Even though the clock signal selecting apparatus 300 only outputs the second phase-controlled clock signal CLK_BD selected by the selector 350, the first and second phase-controlled clock signals CLK_AD and CLK_BD output from the first and second multi-phase comparison/synthesis clock signal generators 330 and 340 have already been controlled to be in synchronization with each other within a predetermined error range. Therefore, even when the first and second phase-controlled clock signals CLK_AD and CLK_BD are switched from one to the other, it is possible to continuously provide a stable output clock signal (CLK_OUT).

Figure 5:
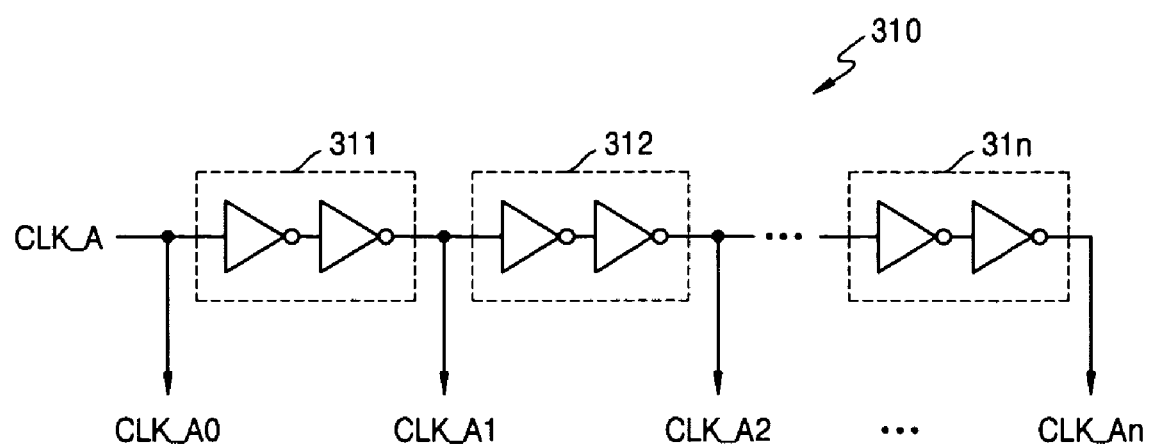
FIG. 5 is a circuit diagram illustrating a first multi-phase clock signal generator of FIG. 3.

FIG. 5 is a circuit diagram illustrating the first multi-phase clock signal generator 310 of FIG. 3. Referring to FIG. 5, the first multi-phase clock signal generator 310 includes n delay devices 311 through 31n (where n is a positive integer). The delay devices 311 through 31n sequentially delay the clock signal CLK_A input to the first multi-phase clock signal generator 310, thereby generating the multi-phase clock signals CLK_A0 through CLK_An. The first and (n+1)-th multi-phase clock signals CLK_A0 and CLK_An have as much a time difference as at least two cycles of one of the first and second clock signals CLK_A and CLK_B that has a lower frequency.

The second multi-phase clock signal generator 320 of FIG. 3 may have a different structure from the first multi-phase clock signal generator 310 of FIG. 5. However, for the convenience of explanation, the second multi-phase clock signal generator 320 is assumed to have the same structure as the first multi-phase clock signal generator 310 of FIG. 5, and thus, its detailed description will be skilled.

Figure 6:
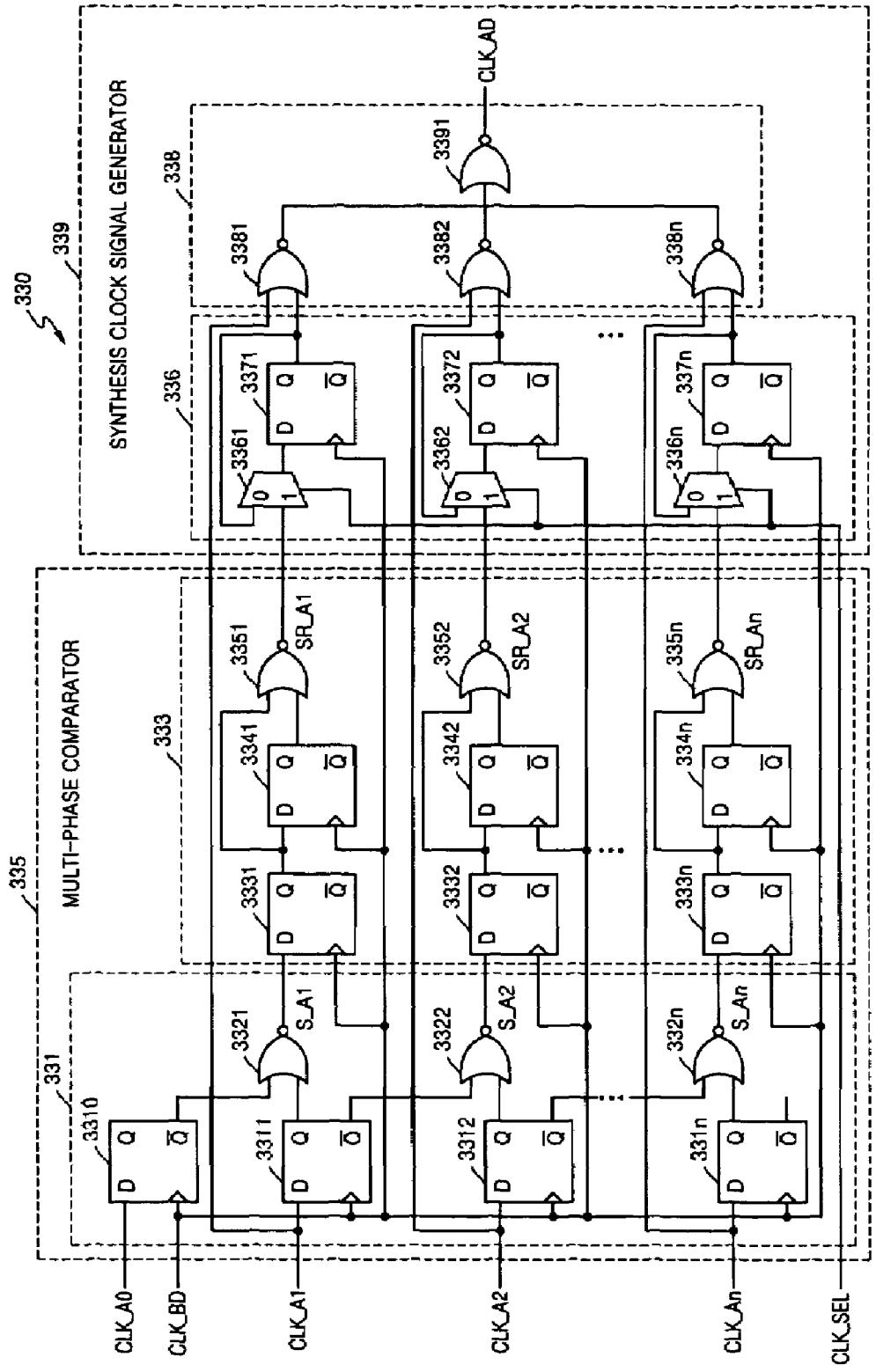
FIG. 6 is a circuit diagram illustrating a first multi-phase comparison/synthesis clock signal generator of FIG. 3.
Figure 7:
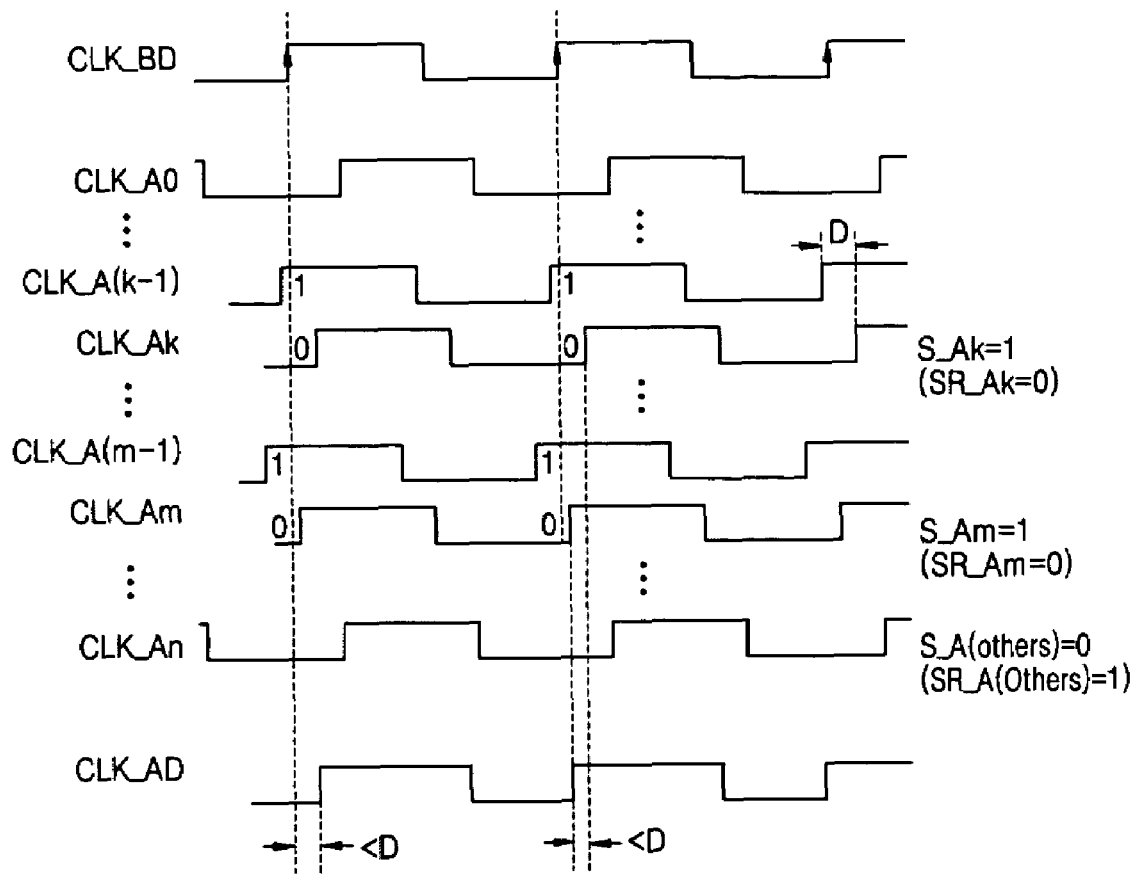
FIG. 7 is a timing diagram illustrating the operation of the first multi-phase comparison/synthesis clock signal generator of FIG. 6.

FIG. 6 is a circuit diagram illustrating the first multi-phase comparison/synthesis clock signal generator 330 of FIG. 3, and FIG. 7 is a timing diagram illustrating the operation of the first multi-phase comparison/synthesis clock signal generator 300.

Referring to FIG. 6, the first multi-phase comparison/synthesis clock signal generator 330 includes a multi-phase comparator 335 and a synthesis clock signal generator 339. The first multi-phase comparison/synthesis clock signal generator 330 compares the phases of the multi-phase clock signals CLK_A0 through CLK_An with the phase of the second phase-controlled clock signal CLK_BD and generates the first phase-controlled clock signal CLK_AD having a phase which is controlled to follow the phase of the second phase-controlled clock signal CLK_BD.

The multi-phase comparator 335 of the first multi-phase comparison/synthesis clock signal generator 330 includes a phase comparator 331 and a clock stabilizer 333.

The phase comparator 331 includes n+1 first D-flipflops 3310 through 331n and n first NOR gates 3321 through 332n. Each of the first D-flipflops 3310 through 331n receives the second phase-controlled clock signal CLK_BD from the second multi-phase comparison/synthesis clock signal generator 340 and one of the multi-phase clock signals CLK_A0 through CLK_An. Each of the first NOR gates 3321 through 332n performs an NOR operation on an inverted output signal and a non-inverted output signal of every two consecutive first D-flipflops.

The first D-flipflops 3310 through 331n sample logic values of the n+1 multi-phase clock signals CLK_A0 through CLK_An at a rising edge of the second phase-controlled clock signal CLK_BD output from the second multi-phase comparison/synthesis clock signal generator 340. Total delay time between the first multi-phase clock signal and the (n+1)-th multi-phase clock signal amounts to at least two cycles of an input clock signal. Thus, an occasion when logic values sampled from two consecutive multi-phase clock signals are 1 and 0 occurs at least two times. In other words, rising edges of at least two multi-phase clock signals are almost in synchronization with the rising edge of the second phase-controlled clock signal CLK_BD. Referring to FIG. 7, logic values sampled from the (k−1)-th multi-phase clock signal CLK_A(k−1) and the k-th multi-phase clock signal CLK_Ak are 1 and 0, and logic values sampled from the (m−1)-th multi-phase clock signal CLK_A(m−1) and the m-th multi-phase clock signal CLK_Am are also 1 and 0. Here, $1 \leq k \leq n$, $1 \leq m \leq n$, and k<m.

The k-th NOR gate 332k, which is one of the first NOR gates 3321 through 332n and is connected to output ports of the (k−1)-th and k-th first D-flipflops 331 (k−1) and 331k, receives the logic values sampled from the (k−1)-th and k-th multi-phase clock signals CLK_A(k−1) and CLK_Ak (where k is an integer satisfying the following inequality: $1 \leq k \leq n$) and determines whether a rising edge of the k-th multi-phase clock signal CLK_Ak follows a rising edge of the second phase-controlled clock signal CLK_BD. For this, the first NOR gates 3321 through 332n output logic values sampled from their respective two consecutive multi-phase clock signals only when the sampled logic values are 1 and 0. Therefore, as shown in FIG. 7, among phase comparison result signals S_A1 through S_An output from the phase comparator 331, only k-th and m-th phase comparison result signals S_Ak and S_Am have a logic value of 1, and the rest of the phase comparison result signals S_A1 through S_An have a logic value of 0. This means the phases of the k-th and m-th multi-phase clock signals CLK_Ak and CLK_Am are different from the phase of the second phase-controlled clock signal CLK_BD by as much as delay time D or less. Here, the delay time D denotes a maximum among delay times of the delay devices 311 through 31n in the first multi-phase clock signal generator 310 of FIG. 5.

In order to solve the problem of metastability that may arise in the first D-flipflops 3310 through 331n, the clock stabilizer 333 includes n pairs of second D-flipflops 3331 and 3341, . . . , 333n and 334n, which each retime output signals of the first NOR gates 3321 through 332n in the phase comparator 331, and n second NOR gates 3351 through 335n, which combine outputs of the second D-flipflops 3331 through 333n with outputs of the second D-flipflops 3341 through 334n. Each of the second NOR gates 3351 through 335n receives outputs of a pair of two second D-flipflops, which are connected to one of the first NOR gates 3321 through 332n in cascade.

In general, D-flipflops perform a sampling process. Therefore, they are more likely to have unstable outputs because a sufficient margin between the time when they receive a data signal and the time when they receive a clock signal is not guaranteed. This phenomenon is called metastability. The problem of metastability is a matter of probability. Therefore, in the present invention, two arrays of second D-flipflops 3331 through 333n and 3341 through 334n are provided to reduce the probability of the problem of metastability occurring by retiming the phase by retiming the phase comparison result signals S_A1 through S_An output from the phase comparator 331. In addition, the second NOR gates 3351 through 335n further reduce the probability of the problem of metastability occurring by combining the output signals of the second D-flipflops 3331 through 333n and 3341 through 334n.

As shown in FIG. 7, logic values of signals SR_A1 through SR_An, which are obtained by retiming each of the phase comparison result signals S_A1 through S_An with the use of one of the pairs of second D-flipflops 3331 and 3341, . . . , 333n and 334n, and combining the retimed phase comparison result signals together, are inverted ones of the logic values of the phase comparison result signals S_A1 through S_An. When each of the signals SR_A1 through SR_An output from the clock stabilizer 333 has a logic value of 0, the phase of a corresponding multi-phase clock signal nearly follows the phase of the second phase-controlled clock signal CLK_BD.

Referring to FIG. 6, the synthesis clock signal generator 339 of the first multi-phase comparison/synthesis clock signal generator 330 includes a clock selector 336 and a first clock signal synthesizer 338.

The clock selector 336 includes n 2-input multiplexers 3361 through 336n, which are respectively connected to the second NOR gates 3351 through 335n, and n third D-flipflops 3371 through 337n, which are respectively connected to output ports of the n 2-input multiplexers 3361 through 336n.

The 2-input multiplexers 3361 through 336n output either the output signals SR_A1 through SR_An of the multi-phase comparator 335 or previous data values output from the third D-flipflops 3371 through 337n. The third D-flipflops 3371 through 337n transmit the signals output from the 2-input multiplexers 3361 through 336n to the first clock signal synthesizer 338 and back to the 2-input multiplexers 3361 through 336n.

If the clock selection signal CLK_SEL is set to a logic value of 1 such that the first clock signal CLK_A is set as a standby clock signal, the 2-input multiplexers 3361 through 336n select and output the output signals SR_A1 through SR_An of the multi-phase comparator 335 so that the phase of the first clock signal CLK_A can be controlled. On the other hand, if the clock selection signal CLK_SEL is set to a logic value of 0 such that the first clock signal CLK_A is set as an active clock signal, the 2-input multiplexers 3361 through 336n select and output the previous data values fed back from the third D-flipflops 3371 through 337n such that the phase of the first clock signal CLK_A can be maintained.

The first clock signal synthesizer 338 includes n third NOR gates 3381 through 338n, which are respectively connected to the third D-flipflops 3371 through 337n, and an N-input NOR gate 3391, which is connected to an output port of each of the third NOR gates 3381 through 338n.

The n third NOR gates 3381 through 338n combine the output signals of the third D-flipflops 3371 through 337n, respectively, with the multi-phase clock signals CLK_A0 through CLK_An, respectively, thereby generating the first phase-controlled clock signal CLK_AD, the phase of which is controlled to follow the phase of the second phase-controlled clock signal CLK_BD.

In other words, the third nor gates 3381 through 338n in the first clock signal synthesizer 338 perform NOR operations on the signals SR_A1 through SR_An input from the third D-flipflops 3371 through 337n of the clock selector 336 and their respective multi-phase clock signals CLK_A1 through CLK_An. Accordingly, if the output signals SR_A1 through SR_An of the third D-flipflops 3371 are set to a logic value of 0, their respective multi-phase clock signals CLK_A1 through CLK_An are inverted and then output. On the other hand, if the output signals SR_A1 through SR_An of the third D-flipflops 3371 are set to a logic value of 1, their respective multi-phase clock signals CLK_A1 through CLK_An, which have a logic value of 0, are output.

As shown in FIG. 7, since the k-th and m-th output signals SR_Ak and SR_Am of the multi-phase comparator 335 each have a logic value of 0, the k-th and m-th multi-phase clock signals CLK_Ak and CLK_Am are output via the k-th and m-th third NOR gates 338k and 338m, respectively, and the rest of the third NOR gates 3381 through 338n output a logic value of 0.

The N-input NOR gate 3391 performs a NOR operation on the output signals of the third NOR gates 3381 through 338n and outputs the NOR operation result as the first phase-controlled clock signal CLK_AD. In other words, the N-input NOR gate 3391 performs a NOR operation on the k-th and m-th multi-phase clock signals CLK_Ak and CLK_Am output from the k-th and m-th third NOR gates 338k and 338m and outputs the NOR operation result as the first phase-controlled clock signal CLK_AD.

As shown in FIG. 7, the first phase-controlled clock signal CLK_AD and the second phase-controlled clock signal CLK_BD, which is an active clock signal, has as much a phase difference as the delay time D or less. However, during performing the NOR operation on the k-th and m-th multi-phase clock signals CLK_Ak and CLK_Am to generate the first phase-controlled clock signal CLK_AD having as much a phase difference with the second phase-controlled clock signal CLK_BD, duty cycles of the k-th and m-th multi-phase clock signals CLK_Ak and CLK_Am may be distorted. In order to prevent this, an additional control means may be used such that only one of the output signals SR_A1 through SR_An of the multi-phase comparator 335 can be set to a logic value of 0 at a time, in which case, the rest of the output signals SR_A1 through SR_An of the multi-phase comparator 335 can be prevented from being set to a logic value of 0.

The second multi-phase comparison/synthesis clock signal generator 340 of FIG. 3 may have a different structure from the first multi-phase comparison/synthesis clock signal generator 330 of FIG. 6. However, for the convenience of explanation, the second multi-phase comparison/synthesis clock signal generator 340 is assumed to have the same structure as the first multi-phase comparison/synthesis clock signal generator 330 of FIG. 6, and thus its description will be skipped.

As described above, in a case where one of the two clock signals CLK_A and CLK_B is designated as an active clock signal in response to the clock selection signal CLK_SEL and the other clock signal is designated as a standby clock signal, the present invention synchronizes the phase of the standby clock signal with the phase of the active clock signal by continuously controlling the phase of the standby clock signal. Therefore, even though the logic value of the clock selection signal CLK_SEL arbitrarily varies such that the two clock signals are switched from one to the other, it is possible to maintain the stability of the output clock signal CLK_OUT because each of the two clock signals CLK_AD and CLK_BD has as much a phase difference with the output clock signal as the delay time D or less.

As described above with reference to FIGS. 3 through 7, the clock signal selecting apparatuses according to the embodiments of the present invention convert two clock signals into a plurality of multi-phase clock signals and compare the phases of the plurality of multi-phase clock signals with the phase of one of the two clock signals in parallel. Accordingly, it is possible to reduce the time taken to perform an entire phase control process and digitalize the entire circuit structure of each of the clock signal selecting apparatuses according to the embodiments of the present invention.

In addition, in the present invention, the phases of the two clock signals are compared with each other every clock cycle. Thus, it is possible to guarantee the continuity of the output clock signal even when the two clock signals have different frequencies.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A clock signal selecting apparatus that guarantees the continuity of an output clock signal, the clock signal selecting apparatus comprising:
   N phase comparators, each of which compares the phase of one of N phase-controlled clock signals with the phase of a second one of said N phase controlled clock signals, which is an active clock signal, and generates one of N control signals that control the phase of one of N clock signals to follow the phase of a predetermined clock signal;
   N phase controllers, which control the phases of the N clock signals in response to the N control signals and generate the N phase-controlled clock signals; and
   a selector, which selects one of the N phase-controlled clock signals corresponding to the active clock signal,
   wherein if each of the N phase-controlled clock signals corresponds to the active clock signal, each of the N phase controllers generates a phase-controlled clock signal having a constant phase difference with an input clock signal, and N is an integer greater than one.

2. The clock signal selecting apparatus of claim 1, wherein if each of the N phase-controlled clock signals corresponds to a standby clock signal, each of the N phase controllers generates a phase-controlled clock signal synchronized with the active clock signal.

3. A clock signal selecting apparatus that guarantees the continuity of an output clock signal, the clock signal selecting apparatus comprising:
   a first phase comparator, which compares first and second phase-controlled clock signals with each other and generates a first control signal that controls the phase of the first phase-controlled clock signal to follow the phase of the second phase-controlled clock signal;
   a second phase comparator, which compares the first and second phase-controlled clock signals with each other and generates a second control signal that controls the phase of the second phase-controlled clock signal to follow the phase of the first phase-controlled clock signal;
   a first phase controller, which generates the first phase-controlled clock signal by controlling the phase of a first clock signal and controls the phase of the first phase-controlled clock signal in response to the first control signal;
   a second phase controller, which generates the second phase-controlled clock signal by controlling the phase of a second clock signal and controls the phase of the second phase-controlled clock signal in response to the second control signal; and
   a selector, which selects one of the first and second phase-controlled clock signals output from the first and second phase controllers, respectively,
   wherein if the first clock signal is designated as an active clock signal, the first phase controller controls the phase of the first phase-controlled clock signal to have a constant difference with respect to the phase of the first clock signal, and
   wherein if the second clock signal is designated as the active clock signal, the second phase controller controls the phase of the second phase-controlled clock signal to have a constant difference with respect to the phase of the second clock signal.

4. The clock signal selecting apparatus of claim 3, wherein if the first clock signal is designated as a standby clock signal, the first phase controller controls the phase of the first phase-controlled clock signal to be in synchronization with the phase of the second phase-controlled clock signal within a predetermined error range in response to the first control signal.

5. The clock signal selecting apparatus of claim 3, wherein if the second clock signal is designated as the standby clock signal, the second phase controller controls the phase of the second phase-controlled clock signal to be in synchronization with the phase of the first phase-controlled clock signal within a predetermined error range in response to the second control signal.

6. A clock signal selecting apparatus that guarantees the continuity of an output clock signal, the clock signal selecting apparatus comprising:
   a first multi-phase clock signal generator, which converts a first clock signal into a plurality of first multi-phase clock signals;
   a second multi-phase clock signal generator, which converts a second clock signal into a plurality of second multi-phase clock signals;
   a first phase comparator/controller, which compares the phases of the first multi-phase clock signals with the phase of a second phase-controlled clock signal and generates a first phase-controlled clock signal by controlling the phase of the first clock signal based on comparison results, the second phase-controlled clock signal being obtained by controlling the phase of the second clock signal;
   a second phase comparator/controller, which compares the phases of the second multi-phase clock signals with the phase of the first phase-controlled clock signal, generates the second phase-controlled clock signal by controlling the phase of the second clock signal based on comparison results, and outputs the second phase-controlled clock signal to the first phase comparator/controller; and a selector, which outputs one of the first and second phase-controlled clock signals in response to a clock selection signal input from the outside of the clock signal selecting apparatus.

7. The clock signal selecting apparatus of claim 6, wherein the clock selection signal selects one of the first and second clock signals as an active clock signal, and designates the other clock signal as a standby clock signal.

8. The clock signal selecting apparatus of claim 7, wherein the first phase comparator/controller generates the first phase-controlled clock signal having a constant phase difference with the first clock signal, if the first clock signal is the active clock signal, and generates the first phase-controlled clock signal synchronized with the second phase-controlled clock signal within a predetermined error range if the first clock signal is the standby clock signal.

9. The clock signal selecting apparatus of claim 7, wherein the second phase comparator/controller generates the second phase-controlled clock signal having a constant phase difference with the second clock signal, if the second clock signal is the active clock signal, and generates the second phase-controlled clock signal synchronized with the first phase-controlled clock signal within a predetermined error range if the second clock signal is the standby clock signal.

10. The clock signal selecting apparatus of claim 6, wherein the first multi-phase clock signal generator comprises a plurality of delay devices, which sequentially delay the first clock signal by a predetermined unit delay time.

11. The clock signal selecting apparatus of claim 6, wherein the second multi-phase clock signal generator comprises a plurality of delay devices, which sequentially delay the second clock signal by a predetermined unit delay time.

12. The clock signal selecting apparatus of claim 6, wherein the first or second phase comparator/controller comprises:

a first multi-phase comparator, which compares the phases of the first multi-phase clock signals with the phase of the second phase-controlled clock signal; and a first synthesis clock signal generator, which combines together at least two of the first multi-phase clock signals having almost the same phase as the second phase-controlled clock signal in response to the clock selection signal.

13. The clock signal selecting apparatus of claim 12, wherein the first multi-phase comparator comprises:

a first phase comparator, which samples logic values from the first multi-phase clock signals at a rising edge of the second phase-controlled clock signal and compares the sampled logic values with one another; and a first clock stabilizer, which removes the possibility of metastability occurring by retiming phase comparison result signals obtained as the comparison results.

14. The clock signal selecting apparatus of claim 13, wherein the first phase comparator comprises: n+1 first D-flipflops, each of which receives the second phase-controlled clock signal and one of the first multi-phase clock signals and samples the logic value of one of the first multi-phase clock signals, n being an integer greater than 1; and n first NOR gates, each of which performs an NOR operation on an inverted output signal and a non-inverted output signal of two consecutive first D-flipflops.

15. The clock signal selecting apparatus of claim 13, wherein the first clock stabilizer comprises:

n pairs of second D-flipflops, each of which retimes one of the output signals of the first phase comparator two times; and n second NOR gates, which combine outputs of their respective pairs of second D-flipflops together.

16. The clock signal selecting apparatus of claim 12, wherein the first synthesis clock signal generator comprises:

a first clock selector, which selects and outputs output signals of the first clock stabilizer or previous data values; and a first clock signal synthesizer, which combines the output signals of the first clock selector with their respective multi-phase clock signals and combines at least two of the combination results having almost the same phase as the second phase-controlled clock signal.

17. The clock signal selecting apparatus of claim 16, wherein the first clock selector comprises:

n 2-input multiplexers, which select and output the output signals of the first clock stabilizer or the previous data values in response to the clock selection signal; and n third D-flipflops, which are respectively connected to output ports of the n 2-input multiplexers, feed back the output signals of the n 2-input multiplexers to the n 2-input multiplexers, and transmit the output signals of the n 2-input multiplexers to the first clock signal synthesizer.

18. The clock signal selecting apparatus of claim 16, wherein the first clock signal synthesizer comprises:

n third NOR gates, which combine the output signals of the first clock selector with their respective multi-phase clock signals and output at least two of the multi-phase clock signals that are almost in synchronization with a rising edge of the second phase-controlled clock signal; and an N-input NOR gate, which generates the first phase-controlled clock signal by combining signals output from the third NOR gates together.

19. A clock signal selecting method that guarantees the continuity of an output clock signal, the clock signal selecting method comprising:

(a) comparing the phase of one of N phase-controlled clock signals with the phase of a second N phase-controlled clock signal which is an active clock signal;

(b) generating a control signal that controls the phase of each of N clock signals to follow the phase of a predetermined clock signal;

(c) generating the N phase-controlled clock signals by controlling the phases of the N clock signals in response to the control signal; and (d) selecting one of the N phase-controlled clock signals corresponding to the active clock signal, wherein if each of the N phase-controlled clock signals corresponds to the active clock signal, each of the N phase controllers generates a phase-controlled clock signal having a constant phase difference with an input clock signal, and N is an integer greater than one.

20. The clock signal selecting method of claim 19, the phases of the N phase-controlled clock signals generated in (c) are synchronized with one another within a predetermined error range.

21. A clock signal selecting method that guarantees the continuity of an output clock signal, the clock signal selecting method comprising:

(a) comparing first and second phase-controlled clock signals, which are obtained by controlling the phases of first and second clock signals, with each other and generating a first control signal that controls the phase of the first phase-controlled clock signal to follow the phase of the second phase-controlled clock signal;

(b) comparing the first and second phase-controlled clock signals with each other and generating a second control signal that controls the phase of the second phase-controlled clock signal to follow the phase of the first phase-controlled clock signal;

(c) controlling the phase of the first phase-controlled clock signal in response to the first control signal;

(d) controlling the phase of the second phase-controlled clock signal in response to the second control signal; and (e) selecting one of the first and second phase-controlled clock signals whose phases are controlled in (c) and (d), respectively, wherein (c) comprises:

(c-1) controlling the phase of the first phase-controlled clock signal to have a constant difference with the phase of the first clock signal if the first clock signal is an active clock signal; and (c-2) controlling the phase of the first phase-controlled clock signal to be in synchronization with the phase of the second phase-controlled clock signal within a predetermined error range in response to the first control signal, if the first clock signal is a standby clock signal.

22. A clock signal selecting method that guarantees the continuity of an output clock signal, the clock signal selecting method comprising:

(a) comparing first and second phase-controlled clock signals, which are obtained by controlling the phases of first and second clock signals, with each other and generating a first control signal that controls the phase of the first phase-controlled clock signal to follow the phase of the second phase-controlled clock signal:

(b) comparing the first and second phase-controlled clock signals with each other and generating a second control signal that controls the phase of the second phase-controlled clock signal to follow the phase of the first phase-controlled clock signal:

(c) controlling the phase of the first phase-controlled clock signal in response to the first control signal:

(d) controlling the phase of the second phase-controlled clock signal in response to the second control signal; and (e) selecting one of the first and second phase-controlled clock signals whose phases are controlled in (c) and (d), respectively, wherein (d) comprises:

(d-1) controlling the phase of the second phase-controlled clock signal to have a constant difference with the phase of the second clock signal if the second clock signal is the active clock signal; and (d-2) controlling the phase of the second phase-controlled clock signal to be in synchronization with the phase of the first phase-controlled clock signal within a predetermined error range in response to the second control signal, if the second clock signal is designated as the standby clock signal.

23. A clock signal selecting method that guarantees the continuity of an output clock signal, the clock signal selecting method comprising:

(a) converting a first clock signal into a plurality of first multi-phase clock signals, and converting a second clock signal into a plurality of second multi-phase clock signals;

(b) comparing the phases of the first multi-phase clock signals with the phase of a second phase-controlled clock signal and selecting at least two of the first multi-phase clock signals having almost the same phase as the second phase-controlled clock signal;

(c) comparing the phases of the second multi-phase clock signals with the phase of a first phase-controlled clock signal and selecting at least two of the second multi-phase clock signals having almost the same phase as the first phase-controlled clock signal;

(d) if the first clock signal is an active clock signal, generating the first phase-controlled clock signal having a constant phase difference with the first clock signal and generating the second phase-controlled clock signal by combining the second multi-phase clock signals selected in (c) together;

(e) if the second clock signal is the active signal, generating the first phase-controlled clock signal having a constant phase difference with the second clock signal and generating the first phase-controlled clock signal by combining the first multi-phase clock signals selected in (b) together; and (f) outputting one of the first or second clock signals, which is designated as the active clock signal, as an output clock signal.

24. The clock signal selecting method of claim 23, wherein the phases of the first and second phase-controlled clock signals generated in (d) and (e), respectively, are synchronized with each other within a predetermined error range.

* * * * *